(12) United States Patent
Yang et al.

(10) Patent No.: US 9,696,580 B2
(45) Date of Patent: Jul. 4, 2017

(54) ARRAY SUBSTRATE AND FABRICATING METHOD THEREOF, AND DISPLAY APPARATUS

(71) Applicant: BOE Technology Group Co., Ltd., Beijing (CN)

(72) Inventors: Tian Yang, Beijing (CN); Yanbing Wu, Beijing (CN); Chunyan Ji, Beijing (CN); Wenbo Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/908,671

(22) PCT Filed: Aug. 12, 2015

(86) PCT No.: PCT/CN2015/086706
§ 371 (c)(1),
(2) Date: Jan. 29, 2016

(87) PCT Pub. No.: WO2016/127610
PCT Pub. Date: Aug. 18, 2016

(65) Prior Publication Data
US 2016/0238882 A1    Aug. 18, 2016

(30) Foreign Application Priority Data
Feb. 15, 2015   (CN) .......................... 2015 1 0082315

(51) Int. Cl.
*H01L 27/12*      (2006.01)
*G02F 1/1335*     (2006.01)
(Continued)

(52) U.S. Cl.
CPC .... *G02F 1/133528* (2013.01); *G02F 1/13439* (2013.01); *H01L 27/124* (2013.01);
(Continued)

(58) Field of Classification Search
CPC .............. H01L 27/1288; H01L 27/124; H01L 27/1259; H01L 27/0266; G02F 1/133528;
(Continued)

(56) References Cited

U.S. PATENT DOCUMENTS 8,120,727 B2 *   2/2012   Wang ................ G02F 1/133536
                                                        349/96
2008/0100779 A1   5/2008   Choo et al.
(Continued)

FOREIGN PATENT DOCUMENTS

CN          1655021 A    8/2005
CN        101097347 A    1/2008
(Continued)

OTHER PUBLICATIONS

Oct. 30, 2015—(WO)—International Search Report and Written Opinion Appn PCT/CN2015/086706 with English Tran.
(Continued)

*Primary Examiner* — Jasmine Clark
(74) *Attorney, Agent, or Firm* — Banner & Witcoff, Ltd.

(57) ABSTRACT

An array substrate and a fabricating method thereof and a display apparatus are provided. The array substrate comprises a base substrate, a pixel electrode layer formed on the base substrate, and a first wire grid polarizing film disposed on a surface of the pixel electrode layer, wherein the first wire grid polarizing film includes a plurality of first metal lines (L1) which are mutually parallel and are periodically arranged; the surface of the pixel electrode layer is a surface of the pixel electrode layer facing the base substrate or a surface of the pixel electrode layer opposite to the base substrate. The array substrate and the fabricating method thereof and the display apparatus can facilitate an ultrathin design.

19 Claims, 3 Drawing Sheets (51) Int. Cl.
*G02F 1/1362* (2006.01)
*G02F 1/1343* (2006.01)

(52) U.S. Cl.
CPC .... *H01L 27/1259* (2013.01); *G02F 1/136286* (2013.01); *G02F 2001/133548* (2013.01)

(58) Field of Classification Search
CPC ... G02F 1/136286; G02F 2001/133548; G02F 1/136227; G02F 1/13362; G02F 1/13439
See application file for complete search history.

(56) References Cited

U.S. PATENT DOCUMENTS

| | | | |
|---|---|---|---|
| 2008/0239210 | A1 | 10/2008 | Araki et al. |
| 2011/0168999 | A1* | 7/2011 | Kim ................. G02F 1/133528 257/59 |
| 2013/0321385 | A1 | 12/2013 | Fujisawa |
| 2014/0354923 | A1 | 12/2014 | Lee et al. |

FOREIGN PATENT DOCUMENTS

| | | |
|---|---|---|
| CN | 101271170 A | 9/2008 |
| CN | 101290446 A | 10/2008 |
| CN | 201438247 U | 4/2010 |
| CN | 202443225 U | 9/2012 |
| CN | 103293776 A | 9/2013 |
| CN | 104330915 A | 2/2015 |
| CN | 104617114 A | 5/2015 |
| CN | 104678643 A | 6/2015 |

OTHER PUBLICATIONS

Feb. 4, 2017—(CN) First Office Action Appn 201510082315.X with English Tran.

* cited by examiner

FIG. 6

ARRAY SUBSTRATE AND FABRICATING METHOD THEREOF, AND DISPLAY APPARATUS

The application is a U.S. National Phase Entry of International Application No. PCT/CN2015/086706 filed on Aug. 12, 2015, designating the United States of America and claiming priority to Chinese Patent Application No. 201510082315.X, filed on Feb. 15, 2015. The present application claims priority to and the benefit of the above-identified applications and the above-identified applications are incorporated by reference herein in their entirety.

TECHNICAL FIELD

Embodiments of the present disclosure relate to an array substrate and a fabricating method thereof and a display apparatus.

BACKGROUND

An increasing number of Thin Film Transistor Liquid Crystal Displays (TFT-LCDs) are applied to a high-performance display field as panel display apparatuses due to characteristics of small size, low power consumption, no radiation, relatively low fabricating cost and the like.

SUMMARY

An embodiment of the present disclosure provide an array substrate, comprising a base substrate, a pixel electrode layer formed on the base substrate, and a first wire grid polarizing film disposed on a surface of the pixel electrode layer, wherein the first wire grid polarizing film includes a plurality of first metal wires which are mutually parallel and are periodically arranged; the surface of the pixel electrode layer is a surface of the pixel electrode layer facing the base substrate or a surface of the pixel electrode layer opposite to the base substrate.

Another embodiment of the present disclosure provides a fabricating method of an array substrate, comprising: providing a base substrate; forming a pixel electrode layer on the base substrate; forming a first wire grid polarizing film on a surface of the pixel electrode layer, wherein the surface of the pixel electrode layer is a surface of the pixel electrode layer facing the base substrate or a surface of the pixel electrode layer opposite to the base substrate; and the first wire grid polarizing film includes a plurality of first metal wires which are mutually parallel and are periodically arranged.

Yet another embodiment of the present disclosure provides a display apparatus, comprising the above array substrate.

BRIEF DESCRIPTION OF THE DRAWINGS

In order to more clearly illustrate the technical solution of the embodiments of the present disclosure, the accompanying drawings required to be used in descriptions of the embodiments or related arts will be briefly described in the following; it is obvious that the accompanying drawings in the description in the following are only related to some embodiments of the present disclosure and are not limitative of the present disclosure.

DETAILED DESCRIPTION

The technical solutions in the embodiments of the present disclosure will be described below in a clearly and fully understandable way in connection with the accompanying drawings. It is obvious that the described embodiments are just a part but not all of the embodiments of the present disclosure. Based on the embodiments in the present disclosure, those ordinarily skilled in the art can obtain all other embodiment(s), without any inventive work, which should be within the scope of the present disclosure.

In a related art, a TFT-LCD is constituted by an array substrate and a color filter substrate, and a liquid crystal layer disposed between the array substrate and the color filter substrate. In addition, a first polarizer is disposed on an upper surface of the color filter substrate, and a second polarizer is disposed between the array substrate and a backlight module. The above polarizers (the first polarizer and the second polarizer), for example, comprise two Triacetyl Cellulose (TAC) protective layers, and a first PolyVingl Acetate (PVA) material layer sandwiched between the TAC protective layers. The polarizer thus formed has large thicknesses, resulting in that the display apparatus formed finally has large thickness. In this case, a limitation is placed on realizing an ultrathin display apparatus, and an ultrathin design of the display apparatus is hardly realized.

The array substrate provided by the embodiment of the present disclosure comprises a plurality of gate lines and a plurality of data lines, the gate lines and the data lines are intersected with each other so as to define pixel units which are arranged in a matrix. Each pixel unit includes a thin-film transistor serving as a switching element and a pixel electrode and a common electrode which are used for controlling an arrangement of liquid crystals. A gate electrode of the thin-film transistor of each pixel unit and a corresponding gate line are electrically connected or integrally formed, a source electrode and a corresponding data line are electrically connected or integrally formed, and a drain electrode and a corresponding pixel electrode are electrically connected or integrally formed. The following description is carried out mainly with respect to a single pixel unit, and other pixel units can be formed similarly.

Figure 1:
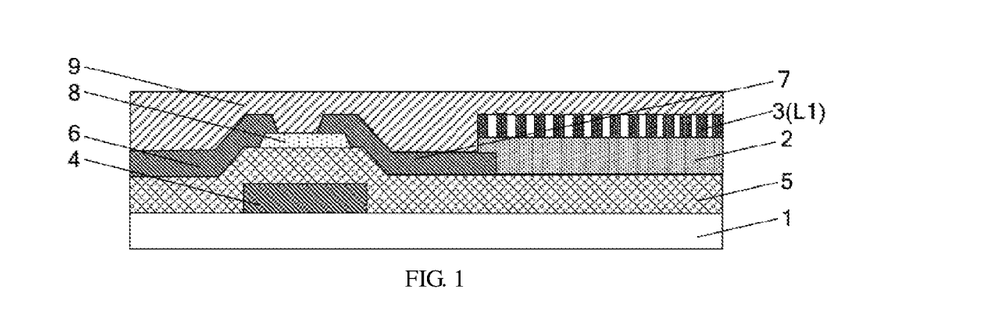
FIG. 1 is a partial cross-sectional schematic structural view of an array substrate provided by an embodiment of the present disclosure.

An embodiment of the present disclosure provides an array substrate; with reference to FIG. 1, the array substrate comprises a base substrate 1, a pixel electrode layer 2 formed on the base substrate 1, and a first wire grid polarizing film 3, wherein:

The first wire grid polarizing film 3 is disposed on a surface of the pixel electrode layer 2.

As shown in FIG. 1, the wire grid polarizing film is disposed on a surface of the pixel electrode layer away from the base substrate (that is, a surface thereof opposite to the base substrate), and also, the first wire grid polarizing film can be disposed on a surface of the pixel electrode layer close to the base substrate (that is, a surface thereof facing the base substrate).

For example, the pixel electrode layer 2 is made of a transparent conductive material.

Here, the first wire grid polarizing film 3 includes a plurality of first metal lines L1 which are mutually parallel and are periodically arranged. For example, with reference to FIG. 1, plural first metal lines L1 are equal in line width and are arranged at equal interval. In a case where the interval between the metal lines are sufficiently shorter than a wavelength of incident light, for example, in a case where a pitch of the first wire grid polarizing film 3 (that is, a distance D between central lines of two adjacent first metal lines L1) is less than or equal to half of the wavelength of the incident light, a component in the incident light which has an electric field vector orthogonal to the first metal lines L1 (that is, p-polarized light) pass through the first wire grid polarizer 3, a component which has an electric field vector parallel to the first metal lines L1 (that is, s-polarized light) is reflected by the first wire grid polarizer 3.

For example, with reference to FIG. 1, the first wire grid polarizing film 3 is in direct contact with the pixel electrode layer 2.

As shown in FIG. 1, the array substrate further comprises a gate electrode 4, a gate insulating layer 5, a source electrode 6, a drain electrode 7, an active layer 8 and a protective layer 9.

Wherein, a material for forming the base substrate 1 can comprise at least one of glass and quartz. In a case that the array substrate is applied to a flexible display apparatus, the material for forming the base substrate 1 can comprise at least one of PolyEthylene Terephthalate (PET) and Tri-Acetyl Cellulose (TAC), so as to meet a design requirement that the flexible display apparatus can be bent and rolled-up.

It is noted that, this embodiment merely illustrates a structure of the array substrate, as shown in FIG. 1. In practical design, just be sure to have an first wire grid polarizing film formed on the pixel electrode layer of the array substrate. An intermediate member can be disposed between the first wire grid polarizing film and the pixel electrode layer. The active layer may be located above the source electrode and the drain electrode or may be located below the source electrode and the drain electrode. The thin-film transistor may be of a top-gate type or may be of a bottom-gate type.

In the array substrate provided by the embodiment of the present disclosure, the first wire grid polarizing film is directly disposed on the pixel electrode layer, such that the pixel electrode layer is partially exposed. In this way, the wire grid polarizing film and the pixel electrode are directly connected with each other. Light rays are polarized by using such wire grid polarizing film, which solves a problem that large thickness of the polarizers in a related display apparatus causes large thickness of the formed display apparatus, and realizes the ultrathin design of the display apparatus. On the other hand, because the wire grid polarizing films are made of a metal material, a resistance of the pixel electrode layer can be reduced, a migration rate of charges is increased, and a display effect of the display apparatus is enhanced.

Figure 2:
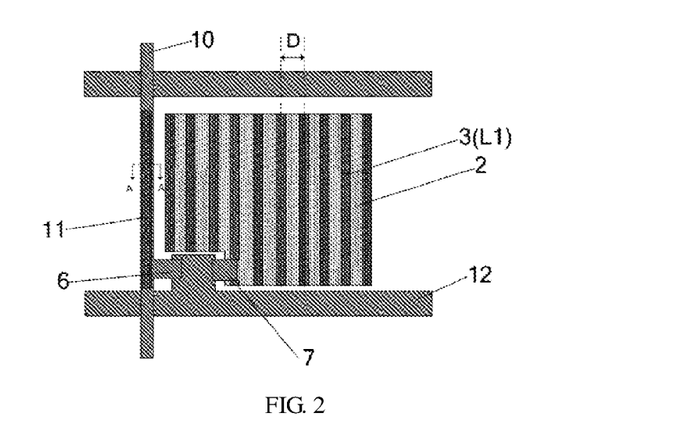
FIG. 2 is a partial plane schematic structural view of an array substrate provided by an embodiment of the present disclosure.

Further, as shown in FIG. 2, the array substrate further comprises a signal line formed on the base substrate 1, wherein:

A second wire grid polarizing film 11 is disposed on a surface of the signal line.

For example, the second wire grid polarizing film may be disposed on a surface of the signal line away from the base substrate (that is, a surface thereof opposite to the base substrate), or may be disposed on a surface of the signal line close to the base substrate (that is, a surface thereof facing the base substrate); and polarizing directions of the first wire grid polarizing film 11 and the first wire grid polarizing film 3 are identical.

Here, the signal line can comprise at least one of a data line and a gate line.

For example, as shown in FIG. 2, this embodiment is exemplarily illustrated by taking a data line 10 serving as the signal line as an example. For example, the second wire grid polarizing film 11 is directly disposed on an upper surface or a lower surface of the data line 10. It is noted that, although the second wire grid polarizing film 11 is merely shown as one line in FIG. 2, in fact, the second wire grid polarizing film 11 includes a plurality of second metal lines L2 which are mutually parallel and are periodically arranged. For example, with reference to FIG. 3, a plurality of second metal lines L2 are equal in line width and are arranged at equal interval.

Figure 3:
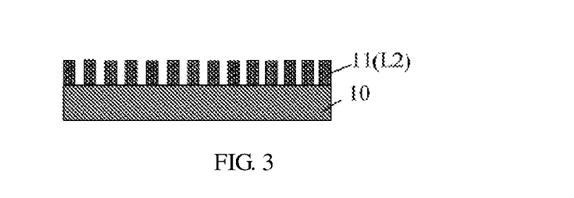
FIG. 3 is a partial schematic cross-sectional view of the array substrate shown in FIG. 2 along A-A'.

The second wire grid polarizing film 11 is, for example, also made of a metal material having a small resistivity. After the display apparatus is electrified, due to the second wire grid polarizing film 11, a resistance of the data line is greatly reduced, a migration rate of charges in the data line is increased, thereby further improving a display performance of the display apparatus.

Pitches of the first wire grid polarizing film 3 and the second wire grid polarizing film 11 are both, for example, 80-150 nm.

On a premise of ensuring that the first wire grid polarizing film and the second wire grid polarizing film can be normally used, the smaller the pitches of the first wire grid polarizing film and the second wire grid polarizing film, the better. However, the smaller the pitches are, the higher fabricating precision is required, and the greater fabricating difficulty is. Accordingly, by comprehensively considering a process difficulty coefficient and a polarizing effect, in the embodiment of the present disclosure, the pitches of the first wire grid polarizing film and the second wire grid polarizing film are set to 80-150 nm.

Materials of the first wire grid polarizing film 3 and the second wire grid polarizing film 11 are, for example, aluminum, silver or an aluminum-silver alloy.

In order to ensure enough charge migration rate after electrification, the first wire grid polarizing film 3 and the second wire grid polarizing film 11 in this embodiment are, for example, made of a metal material having a small resistivity, for example, aluminum, silver or an aluminum-silver alloy. Certainly, the materials of the first wire grid polarizing film and the second wire grid polarizing film are merely exemplified herein, and the material for forming the first wire grid polarizing film and the second wire grid polarizing film is not limited to these materials, and other metals and alloys thereof with an electrical conductivity all can be adopted.

Thicknesses of the first wire grid polarizing film 3 and the second wire grid polarizing film 11 are, for example, 100-200 nm.

If the thicknesses of the first wire grid polarizing film and the second wire grid polarizing film are too small, the step difference between protuberances in the first wire grid polarizing film as well as the second wire grid polarizing film and the pixel electrode layer contacting them are too small, so that the incident light may not be polarized by the formed first wire grid polarizing film and the second wire grid polarizing film. If the thicknesses of the first wire grid polarizing film and the second wire grid polarizing film are excessively large, the thicknesses of the first wire grid polarizing film and the second wire grid polarizing film are excessively large, so that the prepared display device can not satisfy an ultrathin tendency. Therefore, thicknesses of the first wire grid polarizing film 3 and the second wire grid polarizing film 11 in this embodiment are set to 100-200 nm.

As shown in FIG. 2, the array substrate further comprises a gate line 12.

It is noted that, this embodiment is illustrated merely by taking an array substrate in an Active Matrix (AM) liquid crystal display as an example, and similarly, an array substrate for a passive matrix liquid crystal display can also adopt the scheme provided by the embodiment of the present disclosure, which will not be illustrated in detail; In practical designs, solutions satisfying the first wire grid polarizing film is disposed on the surface of the pixel electrode layer and the second wire grid polarizing film is disposed on the surface of the signal line according to the embodiment of the present disclosure is feasible.

In the array substrate provided by the embodiment of the present disclosure, the first wire grid polarizing film is disposed on the pixel electrode layer, such that the pixel electrode is partially exposed. In this way, the wire grid polarizing film and the pixel electrode are directly connected with each other. Light rays are polarized by using such wire grid polarizing film, which solves a problem that large thickness of the polarizers in the related display apparatus causes large thickness of the formed display apparatus, and realizes the ultrathin design of the display apparatus. On the other hand, because the first wire grid polarizing film and the second wire grid polarizing film are made of a metal material, resistances of the pixel electrode layer and the signal line can be respectively reduced, a migration rate of charges is increased, and a display effect of the display apparatus is enhanced.

Figure 4:
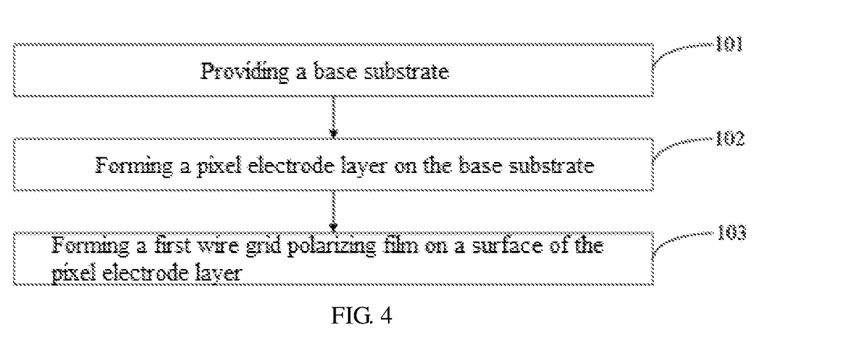
FIG. 4 is a schematic flowchart of a fabricating method of an array substrate provided by an embodiment of the present disclosure.

An embodiment of the present disclosure provides a fabricating method of an array substrate, with reference to FIG. 4, the method comprises steps of:

101: Providing a base substrate.

For example, the base substrate may be made of a material such as glass or quartz. If applied to a flexible display apparatus, the material for forming the base substrate can comprise at least one of PET and TAC.

102: Forming a pixel electrode layer on the base substrate.

103: Forming a first wire grid polarizing film on a surface of the pixel electrode layer.

Wherein, a thickness of the first wire grid polarizing film can be 100-200 nm, and its material can be aluminum, silver or an aluminum-silver alloy.

It is noted that, a sequence of executing step 102 and step 103 is not limited in this embodiment. If the first wire grid polarizing film is formed on a surface of the pixel electrode layer away from the base substrate, the step 103 can be executed after the step 102; if the first wire grid polarizing film is formed on a surface of the pixel electrode layer close to the base substrate, the step 103 can be executed before the step 102. During implementation, the sequence of executing the step 102 and the step 103 can be properly determined according to an actual forming process.

In the fabricating method of the array substrate provided by the embodiment of the present disclosure, the first wire grid polarizing film is disposed on the pixel electrode layer, such that the pixel electrode is partially exposed. In this way, the wire grid polarizing film and the pixel electrode are directly connected with each other. Light rays are polarized by using such wire grid polarizing film, which solves the problem that large thickness of the polarizers in the related display apparatus causes large thickness of the formed display apparatus, and realizes the ultrathin design of the display apparatus. On the other hand, because the first wire grid polarizing film and the second wire grid polarizing film are formed of a metal material, resistances of the pixel electrode layer and the signal line can be respectively reduced, a migration rate of charges is increased, and a display effect of the display apparatus is enhanced.

Figure 5:
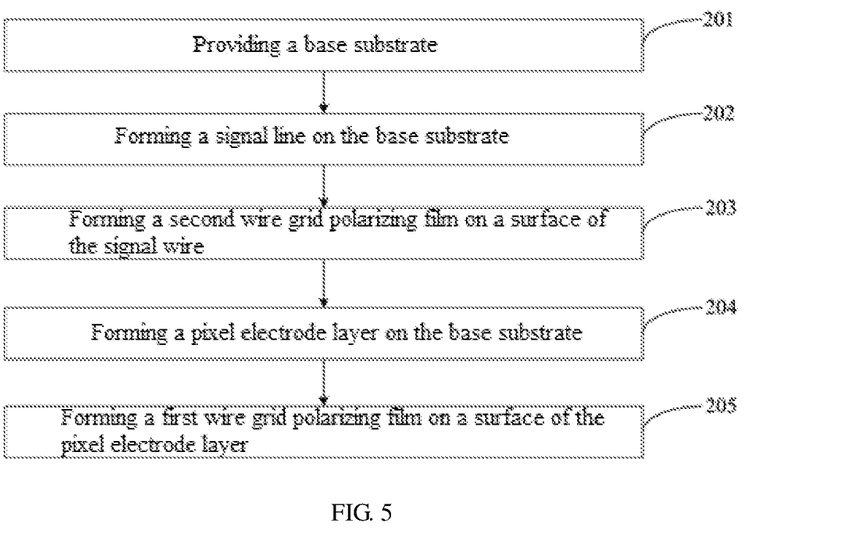
FIG. 5 is a schematic flowchart of another fabricating method of an array substrate provided by another embodiment of the present disclosure.
Figure 6:
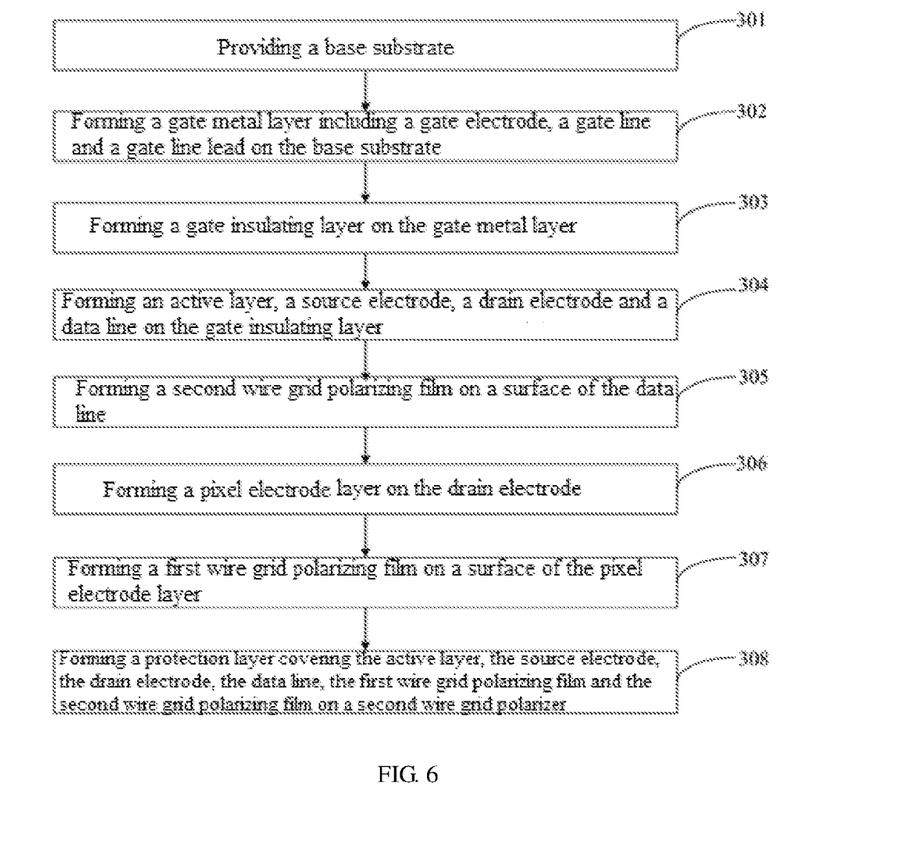
FIG. 6 is a schematic flowchart of yet another fabricating method of an array substrate provided by another embodiment of the present disclosure.

An embodiment of the present disclosure provides a fabricating method of an array substrate, with reference to FIG. 5, the method comprises steps of:

201: Providing a base substrate.

For example, the base substrate can be made of a material such as glass or quartz. If applied to a flexible display apparatus, the material for forming the base substrate can comprise at least one of PET and TAC.

202: Forming a signal line on the base substrate.

Wherein, the signal line includes at least one of a data line and a gate line.

203: Forming a second wire grid polarizing film on a surface of the signal line.

Wherein, a thickness of the second wire grid polarizing film can be 100-200 nm, and its material can be aluminum, silver or an aluminum-silver alloy.

204: Forming a pixel electrode layer on the base substrate.

205: Forming a first wire grid polarizing film on a surface of the pixel electrode layer.

A thickness of the first wire grid polarizing film can be 100-200 nm, and its material may be aluminum, silver or an aluminum-silver alloy.

Wherein, polarizing directions of the second wire grid polarizing film and the first wire grid polarizing film are identical.

It is noted that, a sequence of executing step 202~205 is not limited in this embodiment. In an actual operation, the sequence of executing the steps 202-205 can be determined according to film layer types included by the signal line, a sequence of forming respective film layers, a relationship between the first wire grid polarizing film and the pixel electrode layer and a relationship between the second wire grid polarizing film and film layers of the signal line.

An embodiment of the present disclosure provides a fabricating method of an array substrate, and is illustrated merely by taking a case that a pixel electrode layer is formed above a drain electrode as an example; certainly, the pixel electrode layer may also be formed below the drain electrode; with reference to FIGS. 1-3 and FIG. 5, the signal line in this embodiment, for example, refers to the data line, the second wire grid polarizing film is formed on a surface of the data line away from the base substrate, and the first wire grid polarizing film is formed on a surface of the pixel electrode layer away from the base substrate; and the method comprises steps of:

301: Providing a base substrate 1.

For example, the base substrate 1 can be made of a material such as glass or quartz. If applied to a flexible display apparatus, the material for forming the base substrate can comprise at least one of PET and TAC.

302: Forming a gate metal layer comprising a gate electrode 4, a gate line and a gate line lead on the base substrate 1.

For example, a metal thin film with a thickness of 1000 Å-7000 Å is deposited on the substrate (for example, a glass substrate or a quartz substrate) by adopting a magnetron sputtering method. The metal thin film can generally employ metals such as molybdenum, aluminum, an aluminum-nickel alloy, a molybdenum-tungsten alloy, chromium or copper, or can use a combined structure of thin films of the above several materials. Then, the gate metal layer is formed on a certain region of the substrate with a mask by patterning process including exposure, development, etching and stripping.

303: Forming a gate insulating layer 5 on the gate metal layer.

For example, a gate electrode insulating layer thin film with a thickness of 1000 Å-6000 Å is deposited on a glass substrate by adopting a chemical vapor deposition method or a magnetron sputtering method; a material of the gate insulating layer thin film is generally silicon nitride, or may be silicon oxide, silicon oxynitride and the like.

304: Forming an active layer 8, a source electrode 6, a drain electrode and a data line 7 on the gate insulating layer 5.

For example, a metal oxide semiconductor thin film can be deposited on the gate insulating layer by utilizing a chemical vapor deposition method. Then, the metal oxide semiconductor thin film is subjected to a patterning process to form the active layer. That is, after photoresist is coated, the substrate is exposed, developed and etched by using a mask to form the active layer.

Further, a metal thin layer with a thickness of 1000 Å-7000 Å, which is similar to a gate metal, is deposited on the substrate by employing a method similar to that of fabricating a gate line. The source electrode, the drain electrode and the data line are formed on a certain region by a patterning process.

305: Forming a second wire grid polarizing film on the data line 10.

Wherein, on the data line, forming a second wire grid polarizing film covering the data line, for example, includes steps of:

Forming a layer of metal thin film on the data line by employing a material of aluminum, silver or an aluminum-silver alloy.

For example, a metal thin film with a thickness of 100-200 nm can be evaporated onto the data line, and a material of the metal thin film may be aluminum, silver or an aluminum-silver alloy.

Treating the metal thin film by patterning process including exposure, development and etching, to form the second wire grid polarizing film covering the data line.

For example, a layer of photoresist resin may be firstly coated on the metal thin film, and then exposed and developed to obtain a desired wire grid pattern. Undesired portions of the metal thin film is removed by an etching process (for example, NaOH wet-etching, laser dry-etching or ionic reaction-etching). Then the photoresist is removed by using a stripping solution, so that the second wire grid polarizing film can be formed. The photoresist resin can be transparent resins of a tabular body, a thin-film-shaped body, a sheet-shaped body and the like, which are formed by amorphous thermoplastic resin such as silane, polyethylene resin, polypropylene resin and polyamide resin, a crystalline thermoplastic resin or ultraviolet curing resin, thermo-curing resin and the like. It is noted that, if NaOH etching is used, the metal thin-film can be cleaned and etched in a 0.1% NaOH water solution.

Alternatively, the second wire grid polarizing film 11 on the data line 10 may be formed by steps of:

Forming a layer of metal thin-film on the data line by employing a material of aluminum, silver or an aluminum-silver alloy.

For example, a layer of metal thin film with a thickness of 100-200 nm can be evaporated onto the data line by employing a material of aluminum, silver or an aluminum-silver alloy.

Treating the metal thin-film by an imprinting photoetching patterning process, to form the second wire grid polarizing film covering the data line.

For example, a flowable resin layer is coated on the metal thin film, then the metal thin film is treated by employing an imprinting mould with a precision of less than 10 nm. Then, excess resin layer is removed by laser, and the second wire grid polarizing film is obtained by an etching process.

306: Forming the pixel electrode layer 2 on the drain electrode 7.

ITO or IZO is deposited onto a second passivation layer by adopting a magnetron sputtering method, and then exposed, developed and etched to form the pixel electrode layer.

307: Forming the first wire grid polarizing film 3 on the pixel electrode layer 2.

Wherein, the forming the first wire grid polarizing film 3 on the pixel electrode layer 2, for example, includes steps of:

Forming a layer of metal thin film on the pixel electrode layer, wherein a material of the metal thin film is, for example, aluminum, silver or an aluminum-silver alloy.

Treating the metal thin film by a patterning process including exposure, development and etching, to form the first wire grid polarizing film.

Alternatively, the first wire grid polarizing film on the pixel electrode layer can be formed by steps of:

Forming a layer of metal thin film on the pixel electrode layer, wherein the material of the metal thin film is aluminum, silver or an aluminum-silver alloy.

Treating the metal thin film by an imprinting photoetching patterning process, to form the first wire grid polarizing film.

It is noted that, a process of forming the first wire grid polarizing film 3 in this embodiment is identical to that of forming the second wire grid polarizing film 11, and the first wire grid polarizing film can be formed with reference to the process of forming the second wire grid polarizing film, the detail description of which will be omitted herein.

308: On the first wire grid polarizing film 3, forming a protective layer 9 for covering the active layer 8, the source electrode 6, the drain electrode 7, the data line 10, the first wire grid polarizing film 3 and the second wire grid polarizing film 11.

For example, a passivation layer with a thickness of 1000 Å-6000 Å is coated onto the whole substrate by employing a method similar to that of a gate insulating layer 5 and the active layer, and its material is generally silicon nitride or a transparent organic resin material.

Wherein, a pitches of the first wire grid polarizing film 3 and the second wire grid polarizing film 11 are, for example, 80~150 nm; the thicknesses of the first wire grid polarizing film 3 and the second wire grid polarizing film 11 are, for example, 100~200 nm; the polarizing directions of the first wire grid polarizing film and the second wire grid polarizing film are identical.

It is noted that, this embodiment is illustrated merely by taking a example wherein the first wire grid polarizing film is formed on the surface of the pixel electrode layer away from the base substrate, and the second wire grid polarizing film is formed on the surface of the data line away from the base substrate; the first wire grid polarizing film can also be formed on the surface of the pixel electrode layer close to the base substrate, and the second wire grid polarizing film can also be formed on the surface of the data line close to the base substrate. Certainly, the second wire grid polarizing film can also be formed on a surface of a gate line. A corresponding forming step can be determined with reference to a forming method of the array substrate described in this embodiment in connection with a forming method of film layers of the related array substrate.

In the fabricating method of the array substrate provided by the embodiment of the present disclosure, the first wire grid polarizing film is disposed on the pixel electrode layer, such that the pixel electrode is partially exposed. In this way, the wire grid polarizing film and the pixel electrode are directly connected with each other. Light rays are polarized by using such wire grid polarizing film, which solves a problem that large thickness of the polarizers in the related display apparatus causes large thickness of the formed display apparatus, and realizes the ultrathin design of the display apparatus. On the other hand, because the first wire grid polarizing film and the second wire grid polarizing film are made of a metal material, resistances of the pixel electrode layer and the signal line can be respectively reduced, a migration rate of charges is increased, and a display effect of the display apparatus is enhanced.

An embodiment of the present disclosure provides a display apparatus. The display apparatus comprises any array substrate provided in the above embodiment. One example of the display apparatus is a liquid crystal display apparatus, wherein a TFT array substrate and an opposed substrate are opposed to each other to form a liquid crystal cell, and a liquid crystal material is filled in the liquid crystal cell. The opposed substrate is, for example, a color filter substrate. A pixel electrode of each pixel unit of the TFT array substrate is configured to apply an electric field to control a rotation degree of the liquid crystal material, thereby performing a display operation. In some examples, the liquid crystal display further comprises a backlight source for providing backlight to the array substrate.

The display apparatus can be any product or component with a display function, such as a liquid crystal panel, electronic paper, an OLED panel, a mobile phone, a tablet personal computer, a television, a laptop computer, a digital photo frame and a navigator.

In the display apparatus provided by the embodiment of the present disclosure, the first wire grid polarizing film is directly disposed on the pixel electrode layer, such that the pixel electrode is partially exposed. In this way, the wire grid polarizing film and the pixel electrode are directly connected with each other. Light rays are polarized by using such wire grid polarizing film, which solves a problem that large thickness of the polarizers in the related display apparatus causes large thickness of the formed display apparatus, and realizes the ultrathin design of the display apparatus. On the other hand, because the first wire grid polarizing film and the second wire grid polarizing film are made of a metal material, resistances of the pixel electrode layer and the signal line can be respectively reduced, a migration rate of charges is increased, and a display effect of the display apparatus is enhanced.

Although the present disclosure have been described in detail by using general illustration and detailed implementation modes, some modifications or alterations may be made to it on the basis of the embodiments of the present disclosure, which will be apparent to those skilled in the art. Accordingly, such modifications or alterations without departing from the spirit of the embodiments of the present disclosure all come within the claimed scope of the embodiments of the present disclosure.

The application claims priority of Chinese Patent Application No. 201510082315.X, filed on Feb. 15, 2015, the disclosure of which is incorporated herein by reference in its entirety as part of the present application.

The invention claimed is:

1. An array substrate, comprising a base substrate, a pixel electrode layer formed on the base substrate, and a first wire grid polarizing film disposed on a surface of the pixel electrode layer, wherein the first wire grid polarizing film includes a plurality of first metal lines which are mutually parallel and are periodically arranged;
the surface of the pixel electrode layer is a surface of the pixel electrode layer facing the base substrate or a surface of the pixel electrode layer opposite to the base substrate.

2. The array substrate according to claim 1, wherein the wire grid polarizing film is in direct contact with the pixel electrode layer.

3. The array substrate according to claim 1, further comprising: a signal line formed on the base substrate and a second wire grid polarizing film disposed on a surface of the signal line, wherein the second wire grid polarizing film includes a plurality of second metal lines which are mutually parallel and are periodically arranged;
the surface of the signal line is a surface of the signal line close to the base substrate or a surface of the signal line opposite to the base substrate;
polarizing direction of the second wire grid polarizing film are identical with polarizing direction of the first wire grid polarizing film.

4. The array substrate according to claim 3, wherein the second wire grid polarizing film is in direct contact with the signal line.

5. The array substrate according to claim 3, wherein the signal line includes at least one of a data line and a gate line.

6. The array substrate according to claim 3, wherein pitch of the first wire grid polarizing film and pitch of the second wire grid polarizing film are within a range of 80~150 nm.

7. The array substrate according to claim 3, wherein materials of the first wire grid polarizing film and the second wire grid polarizing film are both aluminum, silver or an aluminum-silver alloy.

8. The array substrate according to claim 3, wherein thickness of the first wire grid polarizing film and thickness of the second wire grid polarizing film are within a range of 100~200 nm.

9. A display apparatus, comprising the array substrate according to claim 1.

10. A fabricating method of an array substrate, comprising:
providing a base substrate;
forming a pixel electrode layer on the base substrate; and
forming a first wire grid polarizing film on a surface of the pixel electrode layer,
wherein the surface of the pixel electrode layer is a surface of the pixel electrode layer facing the base substrate or a surface of the pixel electrode layer opposite to the base substrate, and the first wire grid polarizing film includes a plurality of first metal lines which are mutually parallel and are periodically arranged.

11. The fabricating method according to claim 10, wherein the first wire grid polarizing film is in direct contact with the pixel electrode layer.

12. The fabricating method according to claim 10, wherein the method further comprises:
  forming a signal line on a base substrate;
  forming a second wire grid polarizing film on a surface of the signal line;
  the surface of the signal line is a surface of the signal line facing the base substrate or a surface of the signal line opposite to the base substrate, wherein the second wire grid polarizing film includes a plurality of second metal lines which are mutually parallel and are periodically arranged, and polarizing direction of the second wire grid polarizing film are identical with polarizing direction of the first wire grid polarizing films.

13. The fabricating method according to claim 12, wherein the second wire grid polarizing film is in direct contact with the signal line.

14. The fabricating method according to claim 10, wherein the forming a first wire grid polarizing film on a surface on the pixel electrode layer includes:
  forming a layer of metal thin film on a surface of the pixel electrode layer, wherein a material of the metal thin film is aluminum, silver or an aluminum-silver alloy;
  treating the metal thin film by patterning process including exposure, development and etching, to form the first wire grid polarizing film.

15. The fabricating method according to claim 10, wherein the forming a first wire grid polarizing film on a surface of the pixel electrode layer includes:
  forming a layer of metal thin film on a surface of the pixel electrode layer, wherein a material of the metal thin film is aluminum, silver or an aluminum-silver alloy;
  treating the metal thin film by an imprinting photoetching patterning process, to form the first wire grid polarizing film.

16. The fabricating method according to claim 12, wherein the forming a second wire grid polarizing film on a surface of the signal line includes:
  forming a layer of metal thin film on the surface of the signal line, wherein a material of the metal thin film is aluminum, silver or an aluminum-silver alloy;
  treating the metal thin film by patterning process including exposure, development and etching, to form the second wire grid polarizing film.

17. The fabricating method according to claim 12, wherein the forming a second wire grid polarizing film on a surface of the signal line includes:
  forming a layer of metal thin film on the surface of the signal line, wherein a material of the metal thin film is aluminum, silver or an aluminum-silver alloy;
  treating the metal thin film by an imprinting photoetching patterning process to form the second wire grid polarizing film.

18. The fabricating method according to claim 12, wherein
  pitch of the first wire grid polarizing film and pitch of the second wire grid polarizing film are both within a range of 80~150 nm.

19. The fabricating method according to claim 12, wherein
  thickness of the first wire grid polarizing film and thickness of the second wire grid polarizing film are both within a range of 100~200 nm.

* * * * *